United States Patent [19]

Shaw

[11] 4,283,676
[45] Aug. 11, 1981

[54] DIRECT READING CAPACITANCE METER

[75] Inventor: Clifford O. Shaw, Ridgecrest, Calif.

[73] Assignee: The United States of America as represented by the Secretary of the Navy, Washington, D.C.

[21] Appl. No.: 127,707

[22] Filed: Mar. 6, 1980

[51] Int. Cl.³ .............................. G01R 11/52
[52] U.S. Cl. .................................... 324/60 C
[58] Field of Search ............ 324/60 C, 60 R, 60 CD, 324/57 R

[56] References Cited

U.S. PATENT DOCUMENTS

| | | | |
|---|---|---|---|
| 3,042,860 | 7/1962 | Shillington | 324/60 R |
| 3,325,727 | 6/1967 | Haas | 324/60 R |
| 3,452,272 | 6/1969 | Collins et al. | 324/60 C |
| 3,453,535 | 7/1969 | Anglin | 324/60 C |
| 3,530,379 | 9/1970 | Demerliac | 324/60 R |
| 3,656,000 | 4/1972 | Neathery | 324/60 CD |
| 3,668,523 | 6/1972 | Kuhn | 324/60 C X |
| 3,761,805 | 9/1973 | Dornberger | 324/60 C |
| 3,761,812 | 9/1973 | Plake | 324/57 R X |
| 3,824,459 | 7/1974 | Uchida | 324/60 CD |
| 3,986,108 | 10/1976 | Thomas | 324/60 C |

Primary Examiner—Stanley T. Krawczewicz
Attorney, Agent, or Firm—R. S. Sciascia; W. Thom Skeer; James B. Bechtel

[57] ABSTRACT

A high capacitance measuring apparatus which provides a direct reading of an unknown large capacitor using a voltage comparator, a multi-vibrator flip-flop circuit, and a ramp generator. A timing post which corresponds to one RC time for the capacitor being measured feeds into a ramp generator. The ramp generator output produces an indication on a calibrated meter to give a direct reading.

5 Claims, 3 Drawing Figures

DIRECT READING CAPACITANCE METER

BACKGROUND OF THE INVENTION

This invention relates to an apparatus for measuring capacitance, especially large capacitance. The resulting measurement is displayed on a meter calibrated in capacitance.

One method of determining the capacitance of a large, unknown capacitor is to charge it to a predetermined DC voltage, then discharge it through a known resistor and an SCR while observing the discharge wave form on an oscilloscope, then calculating the capacitance from the time for it to discharge to 37% of its charge voltage. This method does take a set amount of time and some accuracy may be lost in determining the time required for the wave form to reach 37% of the charge voltage.

Another method is to insert the unknown capacitor in a bridge circuit in which fixed capacitors and, in some cases, other circuit elements are provided. The measurement is obtained either by reading a meter indicating the imbalance in the bridge, or by adjusting one of the capacitors in the bridge until a balanced condition is reached and then reading the desired measurement from a calibrated knob. This method can give quite precise results; however, a fine touch is needed to tune the knob, and the resulting accuracy depends on the care taken by the operator.

SUMMARY OF THE INVENTION

The present invention obviates the above mentioned prior art by providing a direct reading capacitance meter for measuring a wide range of capacitances. The invention has circuits for a voltage comparator and logic trigger, a flip-flop multi-vibrator, and a ramp generator. The output voltage of the ramp generator is determined by the duration interval of the input pulse, and produces a reading on a meter which is calibrated in three ranges of capacitance to provide the user with a direct reading capacitance meter.

OBJECTS OF THE INVENTION

An object of the invention is to provide an apparatus for quickly, simply, and automatically providing a measurement of an unknown, large capacitor.

Another object of the invention is to provide an apparatus for measuring electrolytic capacitors in which the output from a ramp generator produces a reading on a meter calibrated in capacitance.

A further object of the invention is to provide an apparatus for measuring capacitors of various sizes, incorporating a range changing switch which provides excellent resolution over the various ranges.

Yet another object of the invention is to provide a relatively inexpensive and reliable capacitor measuring apparatus having a digital display.

Other objects and advantages of this invention will be readily appreciated as the same become better understood by reference to the following detailed description as considered in light of the accompanying drawings in which like reference numerals designate like parts throughout the figures thereof, wherein.

DESCRIPTION OF THE PREFERRED EMBODIMENT

Figure 1:
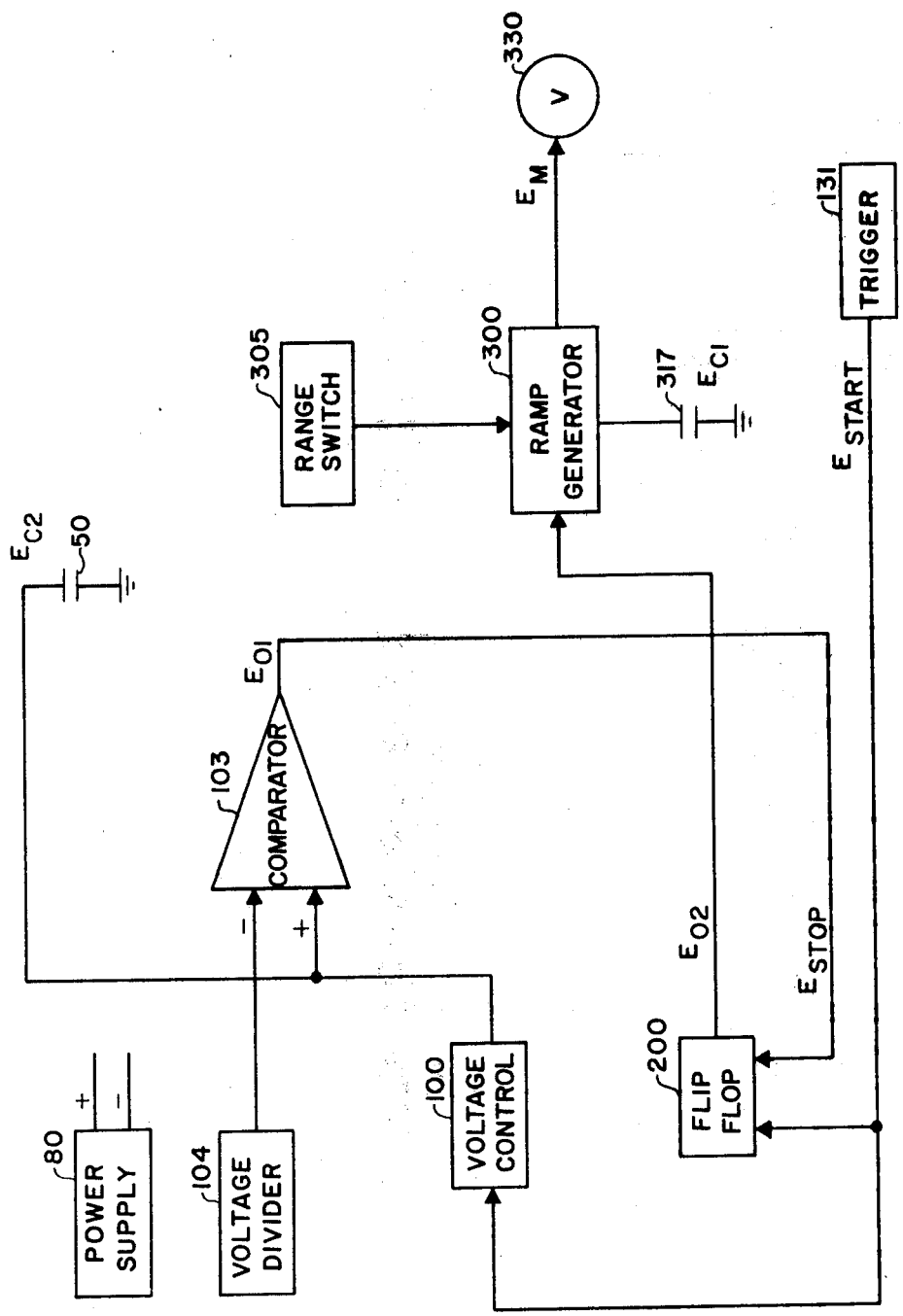
FIG. 1 is a block diagram of one embodiment of the invention.

FIG. 1 is a block diagram of the invention. When a trigger 131 is activated, a charge travels simultaneously to a flip-flop 200 and to a voltage control means 100. The voltage is conducted to a test capacitor 50, and flip-flop 200 is set in a first mode. A first signal is sent to a ramp generator 300 and it begins to charge a reference capacitor 317. The voltage from test capacitor 50 is compared with a reference voltage by a voltage comparator (amplifier) 103, and when the two become equal, comparator 103 sends a signal to flip-flop 200. This sets flip-flop 200 in a second mode, and a second signal is sent to ramp generator 300, which causes it to turn off. The voltage drop across a reference capacitor 317 can then be read directly from a capacitance reading meter 330.

Figure 2:
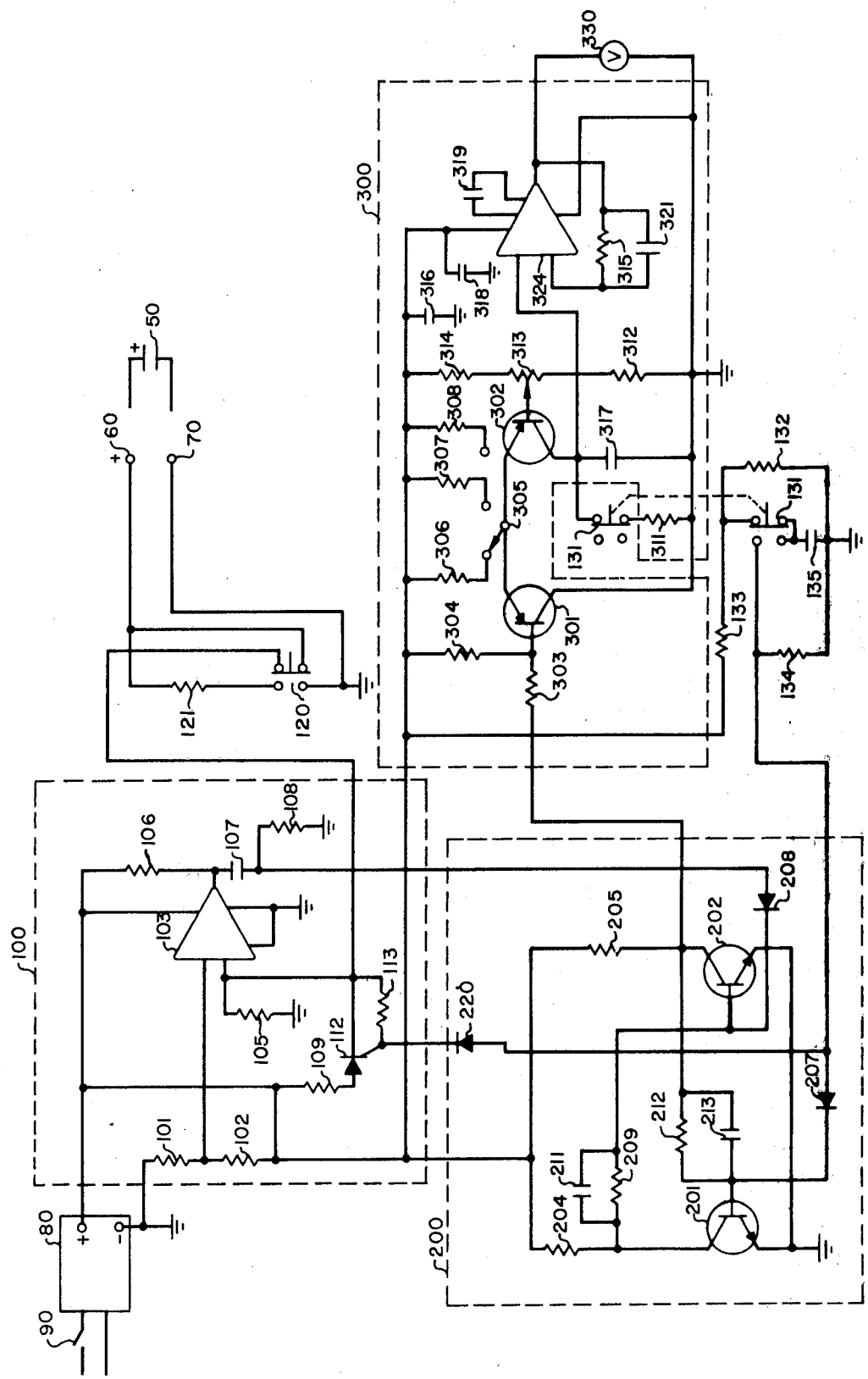
FIG. 2 is a schematic diagram of the embodiment shown in FIG. 1.

FIG. 2 is a schematic diagram of the preferred embodiment and shows the individual components of each major stage: voltage control means 100, flip-flop 200 and ramp generator 300.

Voltage control means 100 is comprised of resistors, 101 and 102, which form a voltage divider 104 to establish a reference voltage; an SCR 112, an SCR gate load resistor 113, and a timing resistor 109, all of which act as a trigger circuit and conduct the voltage from trigger 131; and voltage comparator 103. Power from a power source 80 is sent to resistors 101 and 102, and they establish a reference voltage equal to the capacitance charge voltage on test capacitor 50 during one RC time. An RC consists of the timing resistor and the test capacitor being measured. The reference voltage is connected to the inverting input of voltage comparator 103 which then sends a low voltage output to flip-flop 200. Resistor 105 is an input resistor connected to the non-inverting input of voltage comparator 103 and is equal in value to resistor 101. Resistor 106 is a pullup resistor, and capacitor 107 and resistor 108 make up an output coupling circuit for voltage comparator 103, all of which are generally known in the art.

Flip-flop 200 is comprised of transistors 201 and 202, collector load resistors 204 and 205, steering diodes 207 and 208, and a coupling network consisting of resistor 209, capacitors 211 and 213, and resistor 212. Flip-flop 200 is a circuit with two stable states, capable of remaining in either state indefinitely until triggered by an external signal.

Ramp generator 300 is a gated constant current source and is comprised of transistors 301 and 302, input bias resistors 303 and 304, range resistors 306, 307 and 308, a range switch 305, a reset resistor 311, bias resistors 312, 313, and 314, a feedback resistor 315, reference capacitor 317, filter capacitors 316, 318, and 319, a feedback capacitor 321, and a high input impedance amplifier 324. Amplifier 324, in this circuit, acts as a voltage follower.

In addition to the three major stages the invention also includes the following: capacitance meter 330, calibrated in capacitance for 3 or more ranges; a reset switch 120; a reset resistor 121, manual trigger circuit consisting of trigger 131, a steering diode 220, resistors 132, 133, and 134; and a storage capacitor 135.

Figure 3:
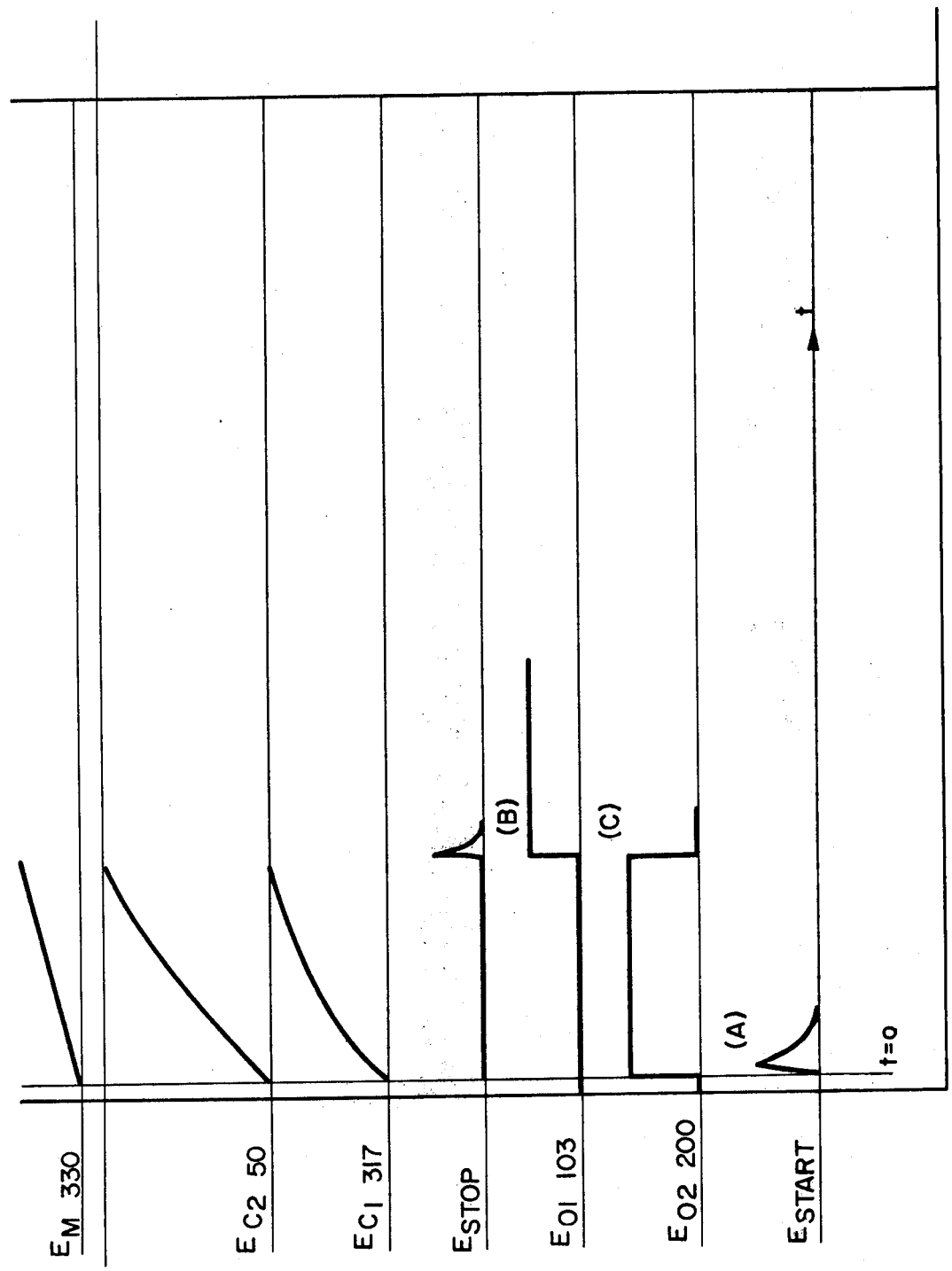
FIG. 3 shows a sequence of wave forms useful in describing the operation of the circuit shown in FIG. 1.

FIG. 3 shows a series of seven wave forms generated at different intervals through the test cycle. Time is plotted along the horizontal or x-axis and voltage is plotted along the vertical or y-axis.

$E_{start}$ shows the voltage initially sent in to the device when trigger 131 is depressed. Prior to that instant, reference capacitor 317, test capacitor 50, and meter 330 are 0. This is shown at wave forms $E_{c1}$, $E_{c2}$, and $E_m$.

At the same time that trigger 131 is depressed, a voltage activates flip-flop 200, which transmits a voltage $E_{02}$ to ramp generator 300. At this point, flip-flop 200 is in its first mode, which is a positive output as shown by $E_{02}$. Simultaneously, a voltage, $E_{c2}$, is sent to voltage comparator 103. Test capacitor 50 starts charging as shown by wave form $E_{c2}$, and meter 330 starts registering a capacitance, as shown by $E_m$.

Point (B) on the $E_{01}$ wave form shows where voltage comparator 103 has determined that the test capacitor voltage has equaled or exceeded the reference voltage. At this point, $E_{stop}$ is sent to flip-flop 200, which puts that component in its second, or lower, mode. This is shown at (C) on wave form $E_{02}$.

Referring now to FIGS. 1 and 2, the operation of the invention is as follows: Test capacitor 50 to be measured is connected across terminals 60 and 70. The invention operates from any typical 115 volt 60 hertz AC power source and power is supplied by switching a power switch 90 to the on position. Storage capacitor 135 will now charge to a voltage determined by resistors 132 and 133 through the normally closed contacts of trigger 131. Reset switch 120 is pressed and held for about 20 seconds to remove any residual charge that may be present on test capacitor 50. Another set of normally closed contacts on trigger 131 insures that capacitor 317 will be discharged through resistor 311.

Trigger 131 is now pressed and held. This action discharges storage capacitor 135 through resistor 134, producing a trigger pulse through diode 207 to transistor 201 and through diode 220 and resistor 113 to SCR 112.

At this point, transistor 202 is conducting and transistor 201 is off, and the base bias for the conducting transistor is provided by the divider action of resistors 204 and 209. Transistor 202 may or may not be saturated by this bias circuit. The OFF transistor stays in that state because its base-to-emitter potential is essentially 0, due to the low potential at the collector of the conducting transistor 202. This results, for practical component values, in the input junction being reverse-biased.

When a signal pulse of positive polarity and of sufficient amplitude and width is supplied to the base of the OFF transistor 201, it immediately turns ON, lowering its collector voltage because of the IR drop across resistor 204. When the voltage does decrease, the biasing that originally dictated that transistor 202 be ON is now nonexistent, and transistor 202 must switch to an OFF condition.

The output waveshape obtained from either collector will be a constant potential with a magnitude of nearly 15 V at certain times, and of approximately 0 at other times, depending upon the history of supplied pulses.

Flip-flop 200 produces a high positive voltage at the collector of transistor 202, which is coupled to the input of ramp generator 300, causing the ramp generator reference capacitor 317 to being charged through one of the preselected range resistors 306, 307, or 308. One of these range resistors is selected by range switch 305 and transistor 302. SCR 112 turns on at this time, thus charging test capacitor 50 through timing resistor 109.

During normal conditions, with power applied, and no capacitor being tested, transistor 301 is conducting and transistor 302 is cut-off. Ramp generator resistors 304 and 303, and flip-flop transistor 202, which is now conducting, provide base bias on transistor 301, allowing it to conduct. Emitter current for transistor 301 flows through resistor 306 (or resistor 307 or 308 if selected by switch 305). The emitter voltage of transistor 301 is approximately 8.2 volts and this voltage is also applied to the emitter of transistor 302. Resistors 312, 313, and 314 determine the base bias voltage for transistor 302. This voltage range is adjustable by resistor 313 and is set to some value above the common emitter voltage on transistors 301 and 302. This reverse biases the base emitter junction of transistor 302, causing it to be in a non-conducting state.

When flip-flop 200 is triggered by a positive pulse applied through diode 207 to the base of transistor 201, transistor 201 turns on causing transistor 202 to turn off. This action removes the base bias from ramp generator transistor 301, causing it to cut off. Transistor 302 emitter voltage now rises to a value above that on the base, causing transistor 302 to become forward biased, turning it on.

Transistor 302 emitter-to-collector current begins charging reference capacitor 317 at a rate determined by resistor 306, 307, or 308. It will continue to charge at a linear rate until it is turned off by a second pulse from flip-flop 200. When transistor 302 turns off, capacitor 317 ceases to receive a charge. The charge voltage on capacitor 317 which corresponds to the pulse width for one RC time of resistor 109 and test capacitor 50 is coupled through the high impedance amplifier 324 to meter 330 which indicates directly the capacitance of test capacitor 50. Due to the high input impedance of amplifier 324, this meter indication will remain stable for a few seconds to allow the operator to record the capacitance reading.

Trigger 131 is now released. This discharges timing capacitor 317 through resistor 311 and recharges storage capacitor 135. Reset switch 120 is now pressed and held for approximately 20 seconds. This discharges capacitor 50 through resistor 121 and resets SCR 112 by removing its anode voltage momentarily.

Obviously, many modifications and variations of the present invention are possible in the light of the above teachings, and, it is therefore understood that within the scope of the disclosed inventive concept, the invention may be practiced otherwise than specifically described.

I claim:

1. A device for measuring the value of a capacitor comprising:
   terminal means for connecting a test capacitor;
   a voltage divider that receives an initial voltage and transmits a predetermined reference voltage;
   sensing means connected to the output of said terminal means and to said voltage divider;
   control means for transmitting a voltage to said sensing means and to said terminal means;
   switching means for receiving and sending a first signal, and further for receiving and sending a second signal;
   a ramp generator having a plurality of charging ranges connected to said switching means to receive a first signal and to supply a voltage and further, to receive a second signal and to stop supplying a voltage;

a reference capacitor connected to said ramp generator;

a capacitance reading meter effectively connected to said reference capacitor;

a trigger having a first and a second mode such that in said first mode no voltage is transmitted and in said second mode a voltage is transmitted simultaneously to said switching means and to said control means, wherein the value of a capacitor is directly determined.

2. The measuring device of claim 1 wherein the voltage divider comprises two resistors of known value.

3. The measuring device of claim 2 wherein said switching means is a flip-flop comprising at least two transistors that operate in two modes wherein in said first mode, a first transistor is in a non-conducting state and a second transistor is in a conducting state, and in said second mode, said first transistor is in a conducting state and said second transistor is in a non-conducting state.

4. A measuring device as in claim 3 wherein said plurality of charging ranges are controlled by a manually adjustable, contact switch that connects one of a plurality of resistors to said ramp generator.

5. A measuring device as in claim 4 wherein an operational amplifier acting as an impedance matching device is connected between said reference capacitor and said capacitance meter.

* * * * *